US012757556B2

(12) United States Patent
Lin et al.

(10) Patent No.: US 12,757,556 B2

(45) Date of Patent: Oct. 6, 2026

(54) INORGANIC LIGHT-EMITTING DIODE DISPLAY

(71) Applicant: Ennostar Corporation, Hsinchu City (TW)

(72) Inventors: Chih-Hao Lin, Hsinchu City (TW); Jian-Chin Liang, Hsinchu City (TW); Jui-Yi Wu, Hsinchu City (TW)

(73) Assignee: ENNOSTAR CORPORATION, Hsinchu City (TW)

(*) Notice: Subject to any disclaimer, the term of this patent is extended or adjusted under 35 U.S.C. 154(b) by 620 days.

(21) Appl. No.: 18/150,559

(22) Filed: Jan. 5, 2023

(65) Prior Publication Data

US 2023/0223386 A1 Jul. 13, 2023

(30) Foreign Application Priority Data

Jan. 11, 2022 (TW) ................................ 111101057

(51) Int. Cl.

*H10H 29/34* (2025.01)
*H10H 29/30* (2025.01)
*H10W 90/00* (2026.01)

(52) U.S. Cl.

CPC ............ *H10H 29/34* (2025.01); *H10H 29/30* (2025.01); *H10H 29/352* (2025.01); *H10W 90/00* (2026.01)

(58) Field of Classification Search

None

See application file for complete search history.

(56) References Cited

U.S. PATENT DOCUMENTS 7,616,184 B2 11/2009 Wen et al.
8,933,959 B2 1/2015 Brown et al.
(Continued)

FOREIGN PATENT DOCUMENTS

CN 104795016 B 6/2016
CN 205355055 U 6/2016
(Continued)

OTHER PUBLICATIONS

Extended European Search Report dated May 25, 2023, issued in application No. EP 23150987.8.
(Continued)

*Primary Examiner* — Feifei Yeung Lopez

(74) *Attorney, Agent, or Firm* — McClure, Qualey & Rodack, LLP

(57) ABSTRACT

An inorganic light-emitting device is provided. The inorganic light-emitting device includes a carrier; a plurality of green chips, a plurality of red chips, and a plurality of blue chips periodically arranged on the carrier. The number of green chips is greater than the number of red chips, and the number of green chips is greater than the number of blue chips. A minimum distance $P_{sub\_g}$ between adjacent ones of the green chips is smaller than a minimum distance $P_{sub\_r}$ between adjacent ones of the red chips in a first direction D1, and the minimum distance $P_{sub\_g}$ between adjacent ones of the green chips is smaller than a minimum distance $P_{sub\_b}$ between adjacent ones of the blue chips in the first direction D1.

19 Claims, 10 Drawing Sheets
(3 of 10 Drawing Sheet(s) Filed in Color)

(56) References Cited

U.S. PATENT DOCUMENTS

| | | | | |
|---|---|---|---|---|
| 9,041,625 | B2 | 5/2015 | Hwang et al. | |
| 9,991,163 | B2 | 6/2018 | Bower et al. | |
| 10,043,483 | B2 | 8/2018 | Song et al. | |
| 10,274,654 | B2 | 4/2019 | Jin et al. | |
| 10,297,646 | B2 | 5/2019 | Yoon et al. | |
| 10,325,959 | B2 | 6/2019 | Wang et al. | |
| 10,468,391 | B2 | 11/2019 | Cok | |
| 10,777,123 | B2 | 9/2020 | Li | |
| 10,840,307 | B2 | 11/2020 | Gu et al. | |
| 10,950,175 | B1 | 3/2021 | Yang et al. | |
| 11,004,906 | B2 | 5/2021 | Lan et al. | |
| 11,164,910 | B2 | 11/2021 | Liu et al. | |
| 2008/0283849 | A1 | 11/2008 | Imai | |
| 2010/0165157 | A1* | 7/2010 | Hyun | H04N 23/843 348/E5.091 |
| 2015/0016104 | A1 | 1/2015 | Wu | |
| 2016/0064363 | A1* | 3/2016 | Bower | H01L 25/167 257/40 |
| 2016/0069517 | A1 | 3/2016 | Horio | |
| 2017/0263828 | A1* | 9/2017 | Mao | H10H 20/824 |
| 2020/0118501 | A1 | 4/2020 | Su et al. | |
| 2021/0105873 | A1 | 4/2021 | Francis | |
| 2021/0217935 | A1 | 7/2021 | Chen et al. | |
| 2021/0241680 | A1* | 8/2021 | Ock | G09G 3/32 |
| 2021/0356650 | A1 | 11/2021 | Xiao | |
| 2022/0165814 | A1 | 5/2022 | Rieutort-Louis et al. | |
| 2022/0399409 | A1 | 12/2022 | Kim | |
| 2023/0352334 | A1* | 11/2023 | Long | H01L 25/0753 |

FOREIGN PATENT DOCUMENTS

| | | | |
|---|---|---|---|
| CN | 106097904 | A | 11/2016 |
| CN | 106486513 | A | 3/2017 |
| CN | 104885141 | B | 3/2018 |
| CN | 108230928 | A | 6/2018 |
| CN | 110209000 | A | 9/2019 |
| CN | 110634908 | A | 12/2019 |
| CN | 108155204 | B | 3/2020 |
| CN | 110945582 | A | 3/2020 |
| CN | 112563312 | A | 3/2021 |
| CN | 113130459 | A | 7/2021 |
| EP | 1 457 953 | A1 | 9/2004 |
| EP | 3 438 964 | A1 | 2/2019 |
| JP | 2023102274 | A | 7/2023 |
| KR | 10-2297348 | B1 | 9/2021 |
| TW | I345107 | B | 7/2011 |
| TW | I534985 | B | 5/2016 |
| TW | M555482 | U | 2/2018 |
| TW | I624821 | B | 5/2018 |
| TW | I673862 | B | 10/2019 |
| TW | 202040547 | A | 11/2020 |
| TW | 202046272 | A | 12/2020 |
| TW | 202129997 | A | 8/2021 |

OTHER PUBLICATIONS

Chinese language office action dated Dec. 29, 2023, issued in application No. TW 111101057.

Chinese language Notice of Allowance dated Dec. 12, 2024, issued in application No. TW 112148676.

Chinese language office action dated May 10, 2024, issued in application No. TW 111101057.

Chinese language office action dated 2023-05-22, issued in application No. TW 111101057.

Japanese language office action dated Feb. 12, 2025, issued in application No. JP 2024-068792.

* cited by examiner

INORGANIC LIGHT-EMITTING DIODE DISPLAY

CROSS REFERENCE TO RELATED APPLICATIONS

This application claims priority of Taiwan Patent Application No. 111101057 filed on Jan. 11, 2022, the entirety of which is incorporated by reference herein.

BACKGROUND

Technical Field

The present disclosure relates to inorganic light-emitting diode displays, and in particular, to sub-pixel arrangement structures of inorganic light-emitting diode displays.

Description of the Related Art

With the ongoing development of display technology, the market currently demands high-performance display panels so they are moving towards high resolution, high brightness and low power consumption. However, as the resolution of display panels increases, the number of sub-pixels of a display panel also increases for high resolution, thereby increasing the manufacturing cost of the display panels. In order to reduce the production cost of the display panels and improve image quality, special arrangements of sub-pixels cooperating algorithms can be applied to display devices to improve the color resolution of the display panels.

Compared to the conventional RGB stripe arrangement used in displays, the tiled-type sub-pixel arrangement has been widely discussed for organic light-emitting diode (OLED) display applications. By increasing the area of red sub-pixels and blue sub-pixels, the current density is reduced to extend the life of the red and blue OLEDs due to their material characteristics, and extend the red and blue light-emitting area. However, the light-emitting area limits the current density. It is therefore impossible to compensate for the brightness of the red and blue light with a higher current, and the diversity of sub-pixel arrangements is reduced. In addition, conventional liquid-crystal displays (LCDs) and organic light-emitting diodes (OLEDs) have a large aperture ratio, which makes it difficult to conduct maintenance. Therefore, it is still necessary to make improvements in display devices so that they have a large current density working range, a large variety of sub-pixel arrangements, and a low aperture ratio, to further improve the color resolution, enhance image quality, and reduce the difficulty of maintenance.

BRIEF SUMMARY

An embodiment of the present disclosure provides an inorganic light-emitting diode (LED) display, including a carrier, a plurality of green chips, a plurality of red chips, and a plurality of blue chips. The green chips, the red chips, and the blue chips are periodically arranged on the carrier, wherein a number of the green chips is greater than a number of the red chips, and the number of the green chips is greater than a number of the blue chips, and wherein a minimum distance $P_{sub\_g}$ between adjacent ones of the green chips is smaller than a minimum distance $P_{sub\_r}$ between adjacent ones of the red chips in a first direction D1, and the minimum distance $P_{sub\_g}$ between adjacent ones of the green chips is smaller than a minimum distance $P_{sub\_b}$ between adjacent ones of the blue chips in the first direction D1.

BRIEF DESCRIPTION OF THE DRAWINGS

Aspects of the present disclosure can be more fully understood from the following detailed description when read with the accompanying figures. It should be noted that, in accordance with standard practice in the industry, various features are not drawn to scale. In fact, the dimensions of the various features may be arbitrarily increased or reduced for clarity of discussion. The patent or application file contains at least one drawing executed in color. Copies of this patent or patent application publication with color drawing(s) will be provided by the Office upon request and payment of the necessary fee.

DETAILED DESCRIPTION

Figure 1:
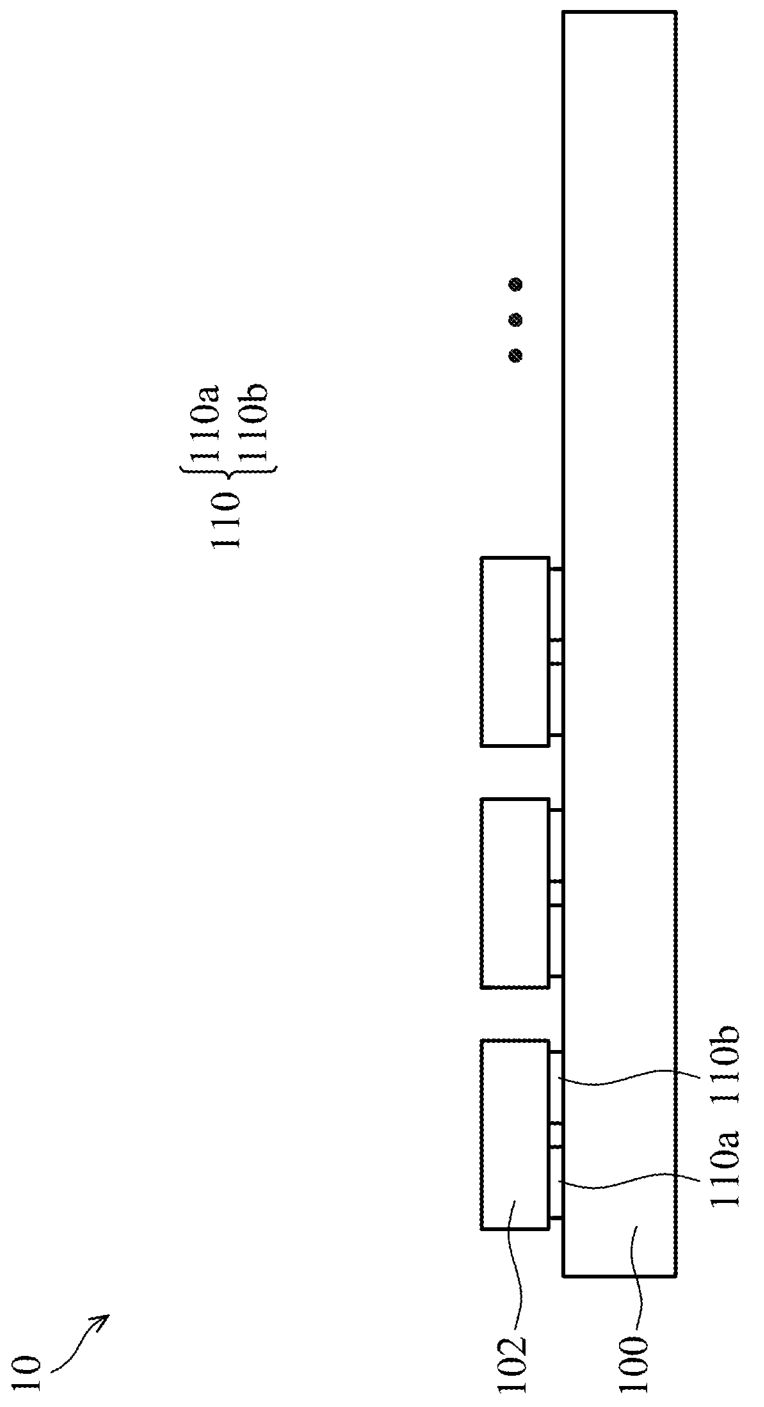
FIG. 1 illustrates a cross-sectional view of an inorganic light-emitting diode (LED) display, according to some embodiments of the present disclosure.

The following disclosure provides many different embodiments, or examples, for light-emitting devices and methods of forming the same. However, it should be noted that the embodiments of the present disclosure provide many concepts of the disclosures that can be implemented in a wide variety of specific contexts. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Some embodiments of the present disclosure provide an inorganic LED display, which includes one or more red inorganic LED chips (also referred to red chip), one or more blue inorganic LED chips (also referred to blue chip), and a number of green inorganic LED chips (also referred to green chip) that is more than that of the red chips and the blue chips. One of the features of the embodiments of the present disclosure is that the number of green chips is greater than the number of red chips, and the number of green chips is greater than the number of blue chips. Sub-pixels (refer to the smallest unit for displaying images, such as a green chip) used in current displays are generally arranged as an RGB stripe with the same number of red, green, and blue chips respectively to form a full pixel. In the display provided by the embodiment of the present disclosure, by increasing the number of green chips and adjusting the minimum distance between chips of different colors, not only the resolution but also the image quality can be further improved.

FIG. 1 illustrates a cross-sectional view of an inorganic LED display according to an embodiment of the present disclosure. In FIG. 1, an inorganic LED display 10 includes a carrier 100 and a plurality of LED chips 102 arranged on the carrier 100 in a two-dimensional array. For the sake of brevity, only three LED chips 102 are shown, but the present disclosure is not limited thereto. Each LED chip 102 has a first electrode 110*a* (e.g., a positive electrode) and a second electrode 110*b* (e.g., a negative electrode). In some embodiments, the polarities of the first electrode 110*a* and the second electrode 110*b* may depend on different types of the LED chips 102. For example, in some embodiments, the first electrode 110*a* is a negative electrode, and the second electrode 110*b* is a positive electrode. The first electrode 110*a* and the second electrode 110*b* are disposed on the same side of the LED chip 102 facing the carrier 100 (which may also be referred to as the back side of the LED chip 102). For example, in some embodiments, the side of the LED chip 102 that is farthest away from the carrier 100 is the light-emitting side (it may also be referred to as the front side), and the first electrode 110*a* and the second electrode 110*b* are disposed on the opposite side of the light-emitting side of the LED chip 102. In some embodiments, the carrier 100 may be a printed circuit board (PCB), a thin film transistor glass (TFT glass), a complementary metal oxide semiconductor (CMOS) carrier, or other suitable materials, but is not limited thereto. The LED chips 102 include green chips 102*g*, red chips 102*r*, and blue chips 102*b*. In some embodiments, the material of the LED chips 102 may include inorganic semiconductor materials, such as III-V compounds, II-VI compounds, or other suitable materials, but is not limited thereto. The III-V compounds can be GaN-based material, GaAs-based material, or InP-based material, and the II-VI compounds can be ZnS-based material or CdSe-based material.

In some embodiments, the material of the first electrode 110*a* and the second electrode 110*b* may be made of metal or a metal alloy. For example, the metal materials of the first electrode 110*a* and the second electrode 110*b* may include (but are not limited to) copper (Cu), aluminum (Al), indium (In), tin (Sn), gold (Au), platinum (Pt), zinc (Zn), silver (Ag), titanium (Ti), nickel (Ni) or a combination thereof.

Figure 2:
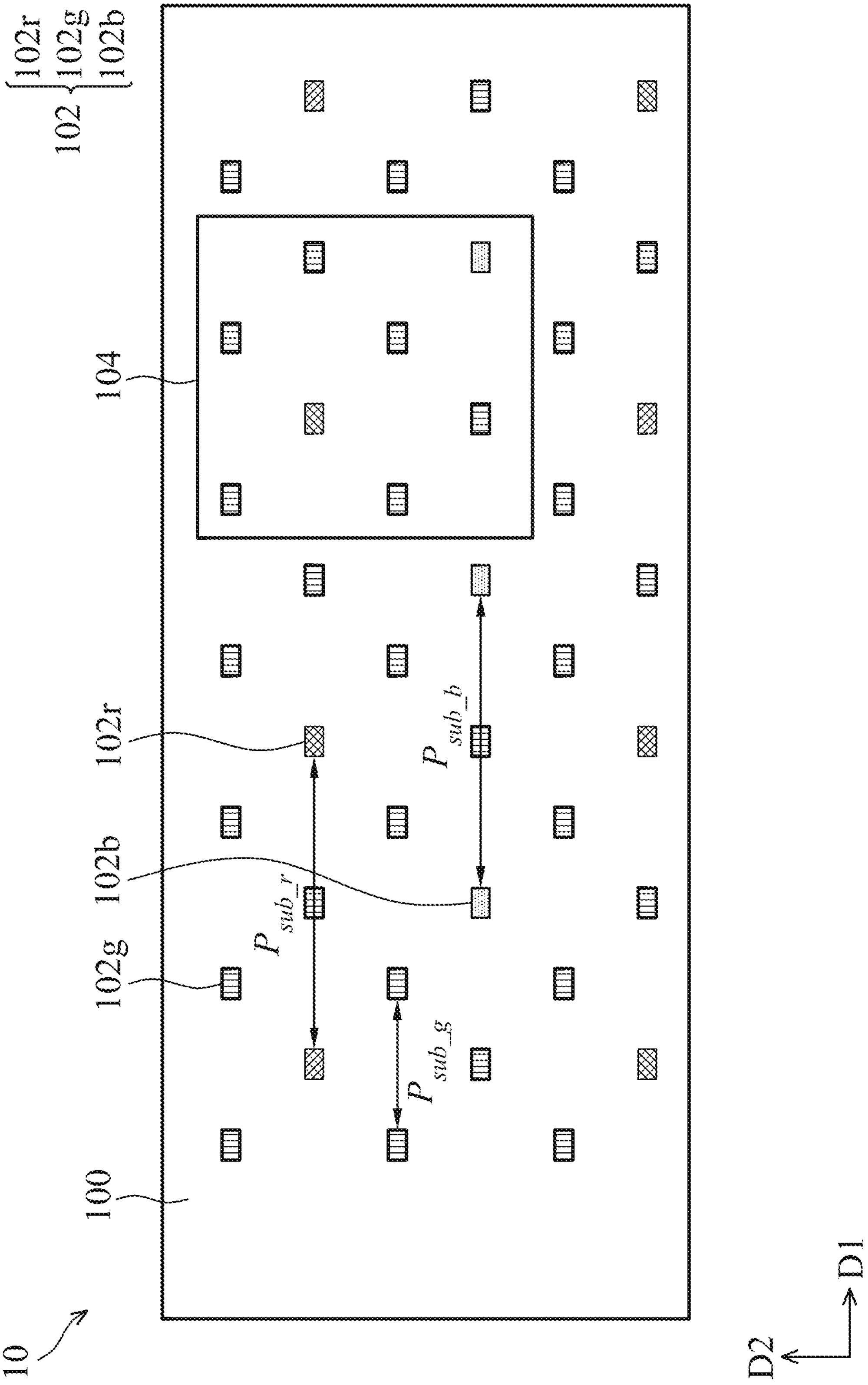
FIG. 2 is a schematic view of sub-pixel arrangement structure of an inorganic LED display, according to some embodiments of the present disclosure.

FIG. 2 illustrates a schematic view of sub-pixel arrangement structure of an inorganic LED display 10 shown in FIG. 1. In FIG. 2, green chips 102*g*, red chips 102*r*, and blue chips 102*b* are arranged periodically on the carrier 100. In some embodiments, the LED chips 102 are arranged extending along a first direction D1 and a second direction D2 which is perpendicular to the first direction D1, as shown in FIG. 2. Since the human eye is more sensitive to the green wavelengths, reducing the distance between the green chips may effectively improve the human eye's ability to perceive denser sub-pixel information. Therefore, the LED chips 102 are disposed in such a way that a minimum distance $P_{sub\_g}$ between two adjacent green chips 102*g* is smaller than a minimum distance $P_{sub\_r}$ between two adjacent red chips 102*r* in a first direction D1; and the minimum distance $P_{sub\_g}$ between two adjacent green chips 102*g* is smaller than a minimum distance $P_{sub\_b}$ between two adjacent blue chips 102*b* in the first direction D1. This sub-pixel arrangement may improve color resolution, provide better image quality using fewer chips, and reduce the manufacturing cost.

Since the human eye's perception of color images is mainly dominated by the color sharing mechanism and the visual limit mechanism, the effects of color sharing and light mixing may be achieved by adjusting the minimum distance between adjacent chips. For example, in order to satisfy the color sharing mechanism (1) and the visual limit mechanism (2) at the same time:

$$15CPD \leq \min\{f(P_{sub\_r}), f(P_{sub\_b})\} \leq 30CPD \tag{1}$$

$$3CPD \leq f(P_{sub\_g}) \leq 60CPD \tag{2}$$

the minimum distance between adjacent color chips may be adjusted to satisfy the following relationship (3) to achieve higher color resolution and better image quality.

$$\frac{1}{2} \times \max\{P_{sub\_r}, P_{sub\_b}\} \geq P_{sub_g} \geq \frac{1}{4} \times \max\{P_{sub\_r}, P_{sub\_b}\} \tag{3}$$

CPD (cycles per degree) is the unit of spatial frequency. The spatial frequency is defined as the number of cycles of black and white stripes that can be recognized per degree of viewing angle in the field of view, and is related to the stripe spacing and the distance between the human eye and the display. For example, When the fringe spacing is P and the distance between the human eye and the display is D, the angular frequency f can be defined as $$f(P) = \frac{1}{\tan^{-1}\left(\frac{2P}{D}\right)}.$$

When the angular frequency f(P) is in the range of 15 CPD~30 CPD, the color sharing mechanism can be achieved. Specifically, in order to make the red chip 102*r* and the blue chip 102*b* on the display enable to share their colors with the surrounding green chips 102*g* respectively, the minimum distance $P_{sub\_r}$ between the two adjacent red chips 102*r* and the minimum distance $P_{sub\_b}$ between the two adjacent blue chips 102*b* may be adjusted in the range of 15 CPD~30 CPD. In some embodiments, only the smallest angular frequency $\min\{f(P_{sub\_r}), f(P_{sub\_b})\}$ between the red chips 102*r* and the blue chips 102*b* is needed to be considered in the range of 15 CPD~30 CPD. When the angular frequency f(P) is in the range of 30 CPD~60 CPD, the visual limit mechanism can be achieved. Specifically, in order to make the red chip 102*r*, the blue chip 102*b*, and the green chips 102*g* on the display to achieve light mixing, the minimum $P_{sub\_r}$ of the adjacent two red chips 102*r*, the minimum distance $P_{sub\_b}$ of the adjacent two blue chips 102*b*, and the minimum distance $P_{sub\_g}$ of the adjacent two green chips 102*g* may be adjusted in the range of 30 CPD~60 CPD. In some embodiments, since the minimum distance $P_{sub\_g}$ between two adjacent green chips 102*g* is the smallest in the first direction D1, only the angular frequency $f(P_{sub\_g})$ of the green chips 102*g* is needed to be considered in the range of 30 CPD~60 CPD.

Still referring to FIG. 2, in some embodiments, a plurality of green chips 102*g*, one red chip 102*r*, and one blue chip 102*b* constitute a minimal repeating unit 104 (also referred to one point unit). The minimal repeating unit 104 has a shape of a rectangular, and repeatedly arranged in two-dimension to constitute an inorganic LED display 10. It should be noted that, in other embodiments, the minimal repeating unit 104 may have a shape of a rectangle, a triangle, a polygon, a circle, and so on, but the present disclosure is not limited thereto. In each minimal repeating unit 104, the number G of green chips 102*g* is the largest, that is, the number G of green chips 102*g* is greater than the number R of red chips 102*r*, and the number G of green chips 102*g* is greater than the number B of blue chips 102*b*. In some embodiments, the number R of red chips 102*r* is greater than the number B of blue chips 102*b* in the minimal repeating unit 104. In some embodiments, the number R of red chips 102*r* is the same as the number B of blue chips 102*b* in the minimal repeating unit 104. Since the ratio of the different colors LED chips 102 in the minimal repeating unit 104 is no longer 1:1:1 (RGB), which is adopted in the conventional arrangement of LED chips, the algorithm is applied in advance to calculate the image depending on the ratio of the different colors LED chips. Finally, according to the calculation result, the image information is transmitted to the LED chips 102 in the minimal repeating unit 104 to display a full image. In some embodiments, the algorithm may be applied using common subpixel rendering (SPR) techniques.

Continuing to FIG. 2, in some embodiments, each LED chip 102 in the minimal repeating unit 104 has substantially the same size. For example, LED chips 102 of different colors have substantially the same size in top view. In some embodiments, the minimal repeating unit 104 has a unit area $S_p$, and each green chip 102*g*, red chip 102*r*, and blue chip 102*b* has a light-emitting area $S_g$, $S_r$, $S_b$, respectively. In some embodiments, the light-emitting areas of different colors chips are the same. For example, $S_g=S_r=S_b$, therefore, compared with the conventional OLED which achieves the display function with different sub-pixel sizes, there is no need to adjust different current densities corresponding to different luminous efficiency, so that the lifetime of each color sub-pixel is substantially equivalent, which reduces the difficulties in design.

In some embodiments, an aperture ratio A of the inorganic LED display 10 is smaller than 30%, as shown in FIG. 2. The aperture ratio A is defined as the ratio of the total light-emitting area of the LED chips 102 to the minimal repeating unit 104, and satisfies the following relationship:

$$A = \frac{GS_g + RS_r + BS_b}{S_p} < 30\% \tag{4}$$

wherein G, R, and B are the number of green chips 102*g*, the number of red chips 102*r*, and the number of blue chips 102*b* in the minimal repeating unit 104, respectively. Compared with the conventional LCDs or OLEDs whose aperture ratio is designed to be 30% to 90%, the present disclosure can provide a lower aperture ratio, which is beneficial for the maintenance for LED chips 102 in the inorganic LED display 10.

Figure 3B:
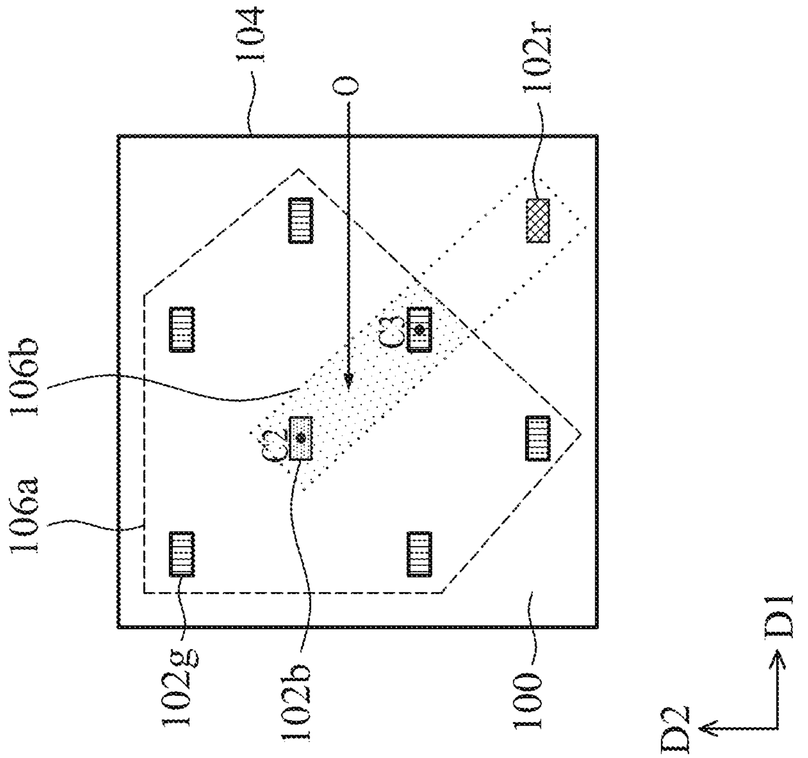
FIGS. 3A-3B are schematic views of sub-pixel arrangement structures of a minimal repeating unit in an inorganic LED display, according to some embodiments of the present disclosure.
Figure 3A:
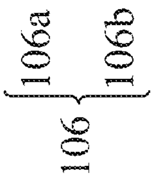
Figure 3A:
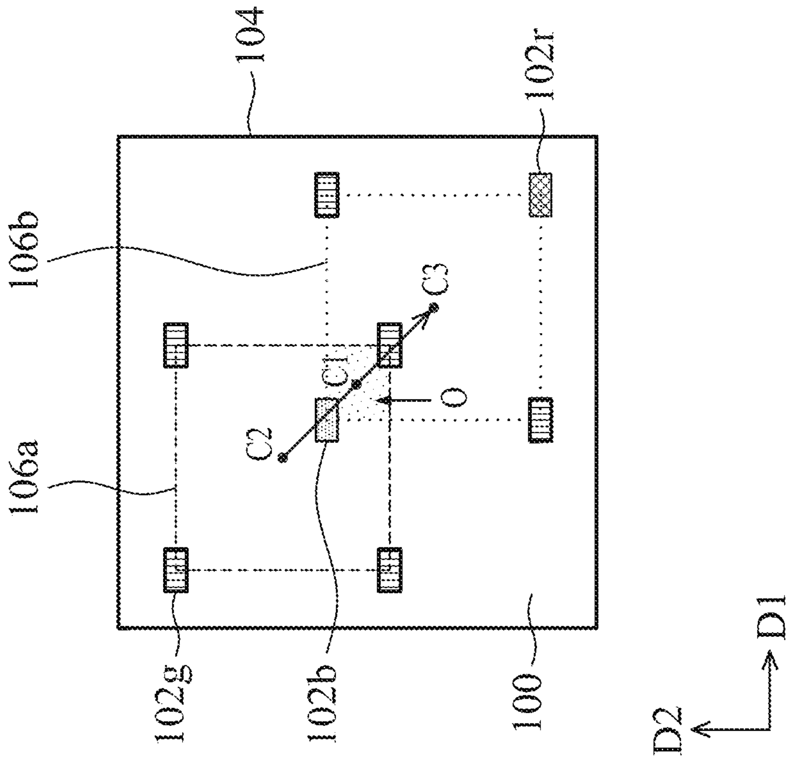

FIGS. 3A-3B schematic views of LED chips 102 arrangement structures within the minimal repeating unit 104 according to various embodiments of the present disclosure. Referring to FIG. 3A, the minimal repeating unit 104 includes a plurality of subunits 106 in some embodiments. For example, the minimal repeating unit 104 includes a first subunit 106*a* and a second subunit 106*b*. The first subunit 106*a* (dashed line) is composed of part of green chips 102*g*, and the second subunit 106*b* (dotted line) is composed of the remaining green chips 102*g* as well as one red chip 102*r* and one blue chip 102*b*. In particular, the subunit 106 includes a geometric center C1 of a top-view shape of the minimal repeating unit 104 as shown in FIG. 3A.

In some embodiments, a geometric center C2 of a top-view shape of the first subunit 106*a* (dashed line) may not overlap with the LED chips 102 of the second subunit 106*b* (dotted line) as shown in FIG. 3A. In some embodiments, a geometric center C3 of a top-view shape of the second subunit 106*b* (dotted line) may not overlap with the LED chips 102 of the first subunit 106*a* (dashed line). In other embodiments, the geometric center C2 of the top-view shape of the first subunit 106*a* (dashed line) may overlap with the LED chips 102 of the second subunit 106*b* (dotted line), and the geometric center C3 of the top-view shape of the second subunit 106*b* (dotted line) may overlap the LED chips 102 of the first subunit 106*a* (dashed line) as shown in FIG. 3B. In this case, six green chips 102*g* constitute a pentagonal first subunit 106*a* (dashed line), and one red chip and one blue chip constitute a rectangular second subunit 106*b* (dotted line). The red chip 102*r* and the blue chip 102*b* are evenly distributed around the green chips 102*g*, which are more numerous than the red chips 102*r* or the blue chips 102*b* in the whole display. Compared to embodiments where the geometric center C2 of the top-view shape of the first subunit 106*a* (dashed line) is not overlapped with the LED chips 102 of the second subunit 106*b* (dotted line), as shown in FIG. 3A, the geometric center C2 of the top-view shape of the first subunit 106*a* (dashed line) and the geometric center C3 of the top-view shape of the second subunit 106*b* (dotted line) are respectively overlapped with the LED chips of the second subunit 106*b* (dotted line) and the LED chips of the first subunit 106*a* (dashed line) respectively as shown in FIG. 3B. Therefore, the red chip 102*r* and the blue chip 102*b* may share color with the surrounding green chips 102*g* more uniformly, which may improve image resolution and improve image quality. It should be noted that the first subunit 106*a* and the second subunit 106*b* have an overlapping area O, and the overlapping area O include the geometric center C2 of the top-view shape of the first subunit 106*a*, such that not only improve the resolution, but also enhance the image quality.

Figure 4B:
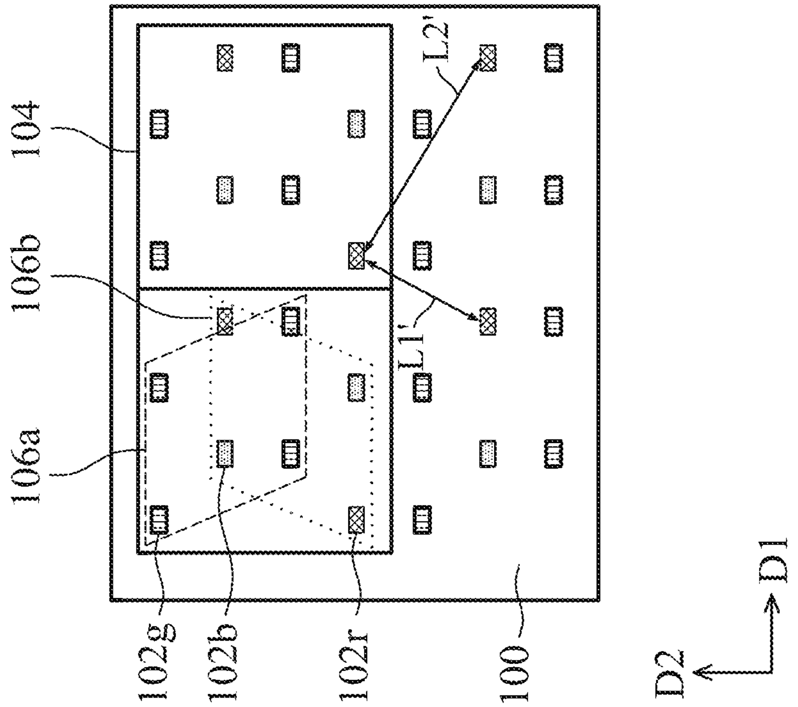
FIGS. 4A, 4B, 5, 6A, 6B, and 6C are schematic views of sub-pixel arrangement structures of a minimal repeating unit in an inorganic LED display, according to various embodiments of the present disclosure.
Figure 4A:
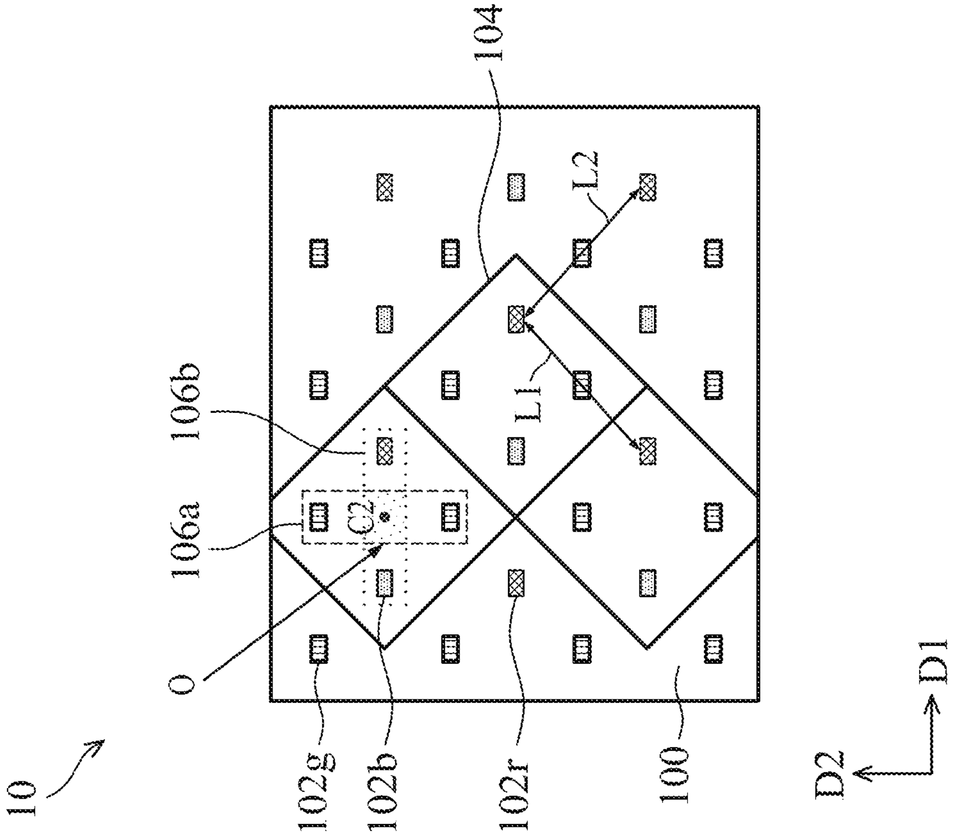

FIGS. 4A-4B illustrate some embodiments in which the ratio of the number of red chips, green chips and blue chips (RGB) in a minimal repeating unit 104 is 1:2:1 according to various embodiments of the present disclosure. First, referring to FIG. 4A, the minimal repeating unit 104 includes 2 green chips, 1 red chip, and 1 blue chip in some embodiments. The two green chips are arranged to constitute a rectangular first subunit 106*a* (dashed line), and 1 red chip and 1 blue chip are arranged to constitute a rectangular second subunit 106*b* (dotted line). The first subunit 106*a* and the second subunit 106*b* have an overlapping area O which includes the geometric center C2 of the top-view shape of the first subunit 106*a*. Besides, the color resolution is improved, since each red chip has the same distance (L1=L2) to the surrounding adjacent red chips, as shown in FIG. 4A, the red chips 102*r* may uniformly sharing the color with the surrounding green chips 102*g*. Hence, the image quality is increased in the first direction D1 and the second direction D2 in equal proportions.

Referring to FIG. 4B, the minimal repeating unit 104 includes 4 green chips, 2 red chips, and 2 blue chips in some embodiments. The four green chips are arranged to constitute a parallelogram first subunit 106*a* (dashed line), and the two red chips and the two blue chips are arranged to constitute a parallelogram second subunit 106*b* (dotted line). Each red chip has different distances to the surrounding adjacent red chips (L1'≠L2'). Due to the distance difference between in the first direction D1 and in the second direction D2, the image quality in the two directions is different. By applying the algorithm, the image quality in a single direction can be strengthened and the color resolution can be improved at the same time.

Figure 5:
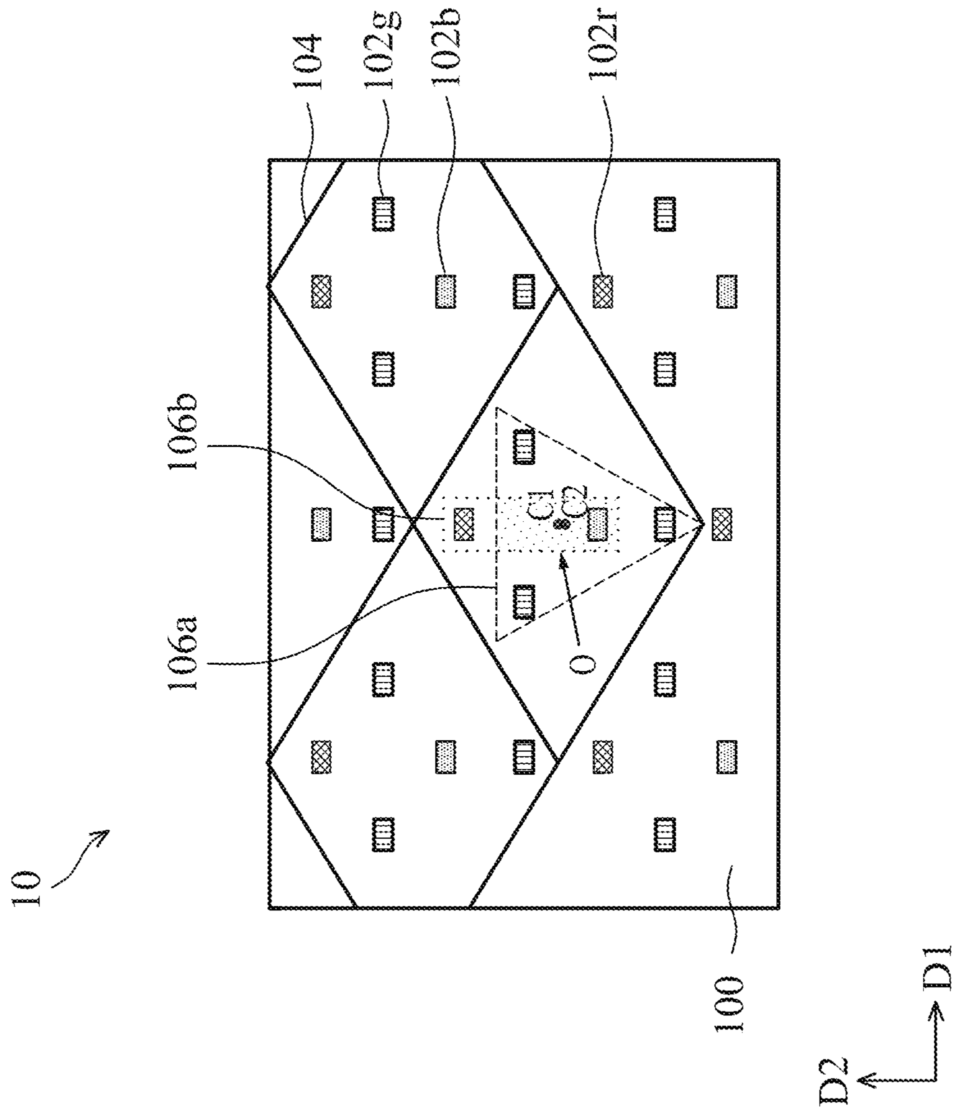

FIG. 5 illustrates some embodiments in which the ratio of the number of red chips, green chips, and blue chips (RGB) in a minimal repeating unit 104 is 1:3:1 according to various embodiments of the present disclosure. In some embodiments, the minimal repeating unit 104 includes 3 green chips, 1 red chip, and 1 blue chip. The three green chips are arranged to constitute a triangular first subunit 106*a* (dashed line), and the one red chip and the one blue chip are arranged to constitute a rectangular second subunit 106*b* (dotted line). The first subunit 106*a* and the second subunit 106*b* have an overlapping area O which includes the geometric center C2 of the top-view shape of the first subunit 106*a*, such that the first subunit 106*a* and the second subunit 106*b* are substantially distributed around the geometric center C1 of the top-view shape of the minimal repeating unit 104. Hence, the red chip 102*r* and the blue chip 102*b* can evenly share color with the surrounding green chips 102g as shown in FIG. 5, so that the color resolution is improved and the image quality is enhanced at the same time.

In some embodiments, the minimal repeating units 104 may not be adjacent to each other, and may be in a staggered (rows and columns) arrangement in the inorganic LED display 10.

Figure 6B:
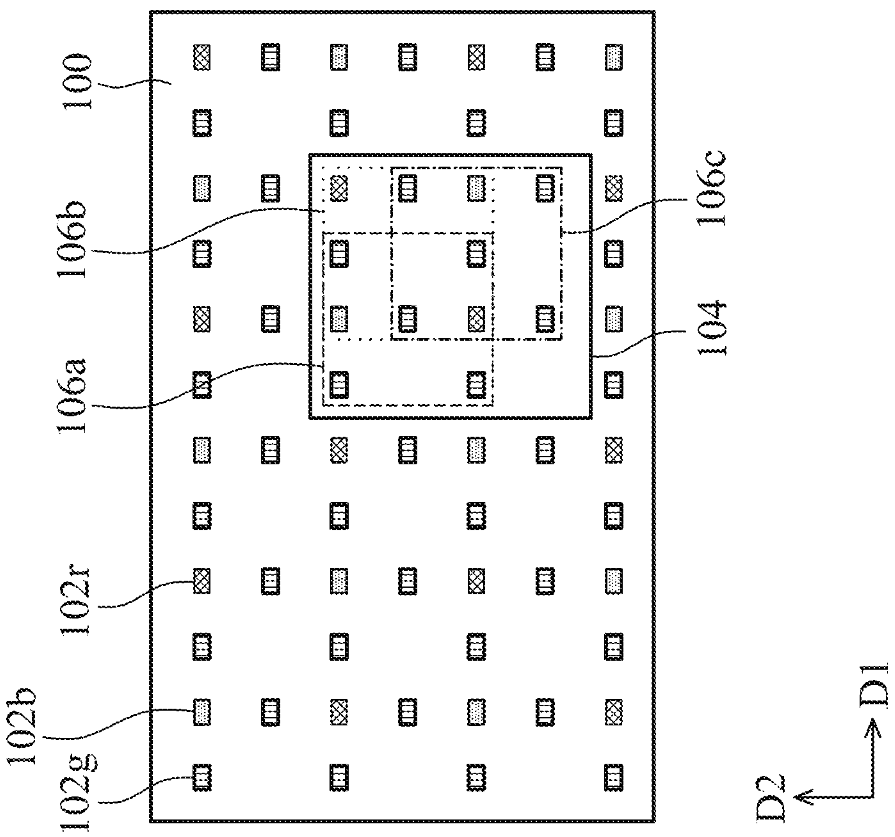
Figure 6A:
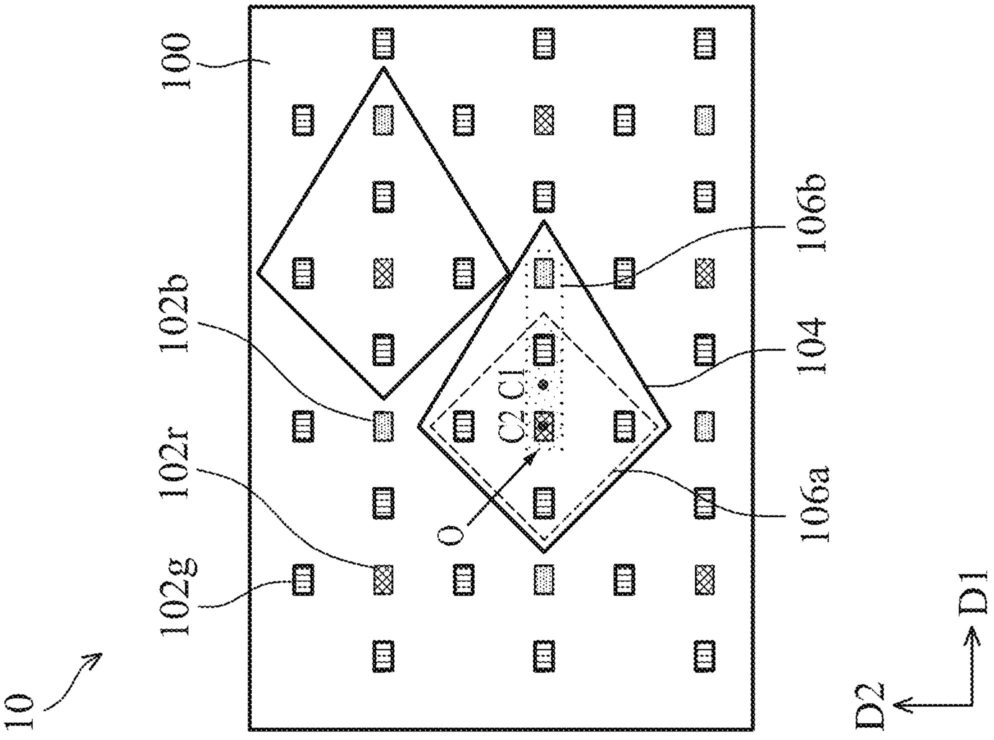
Figure 6C:
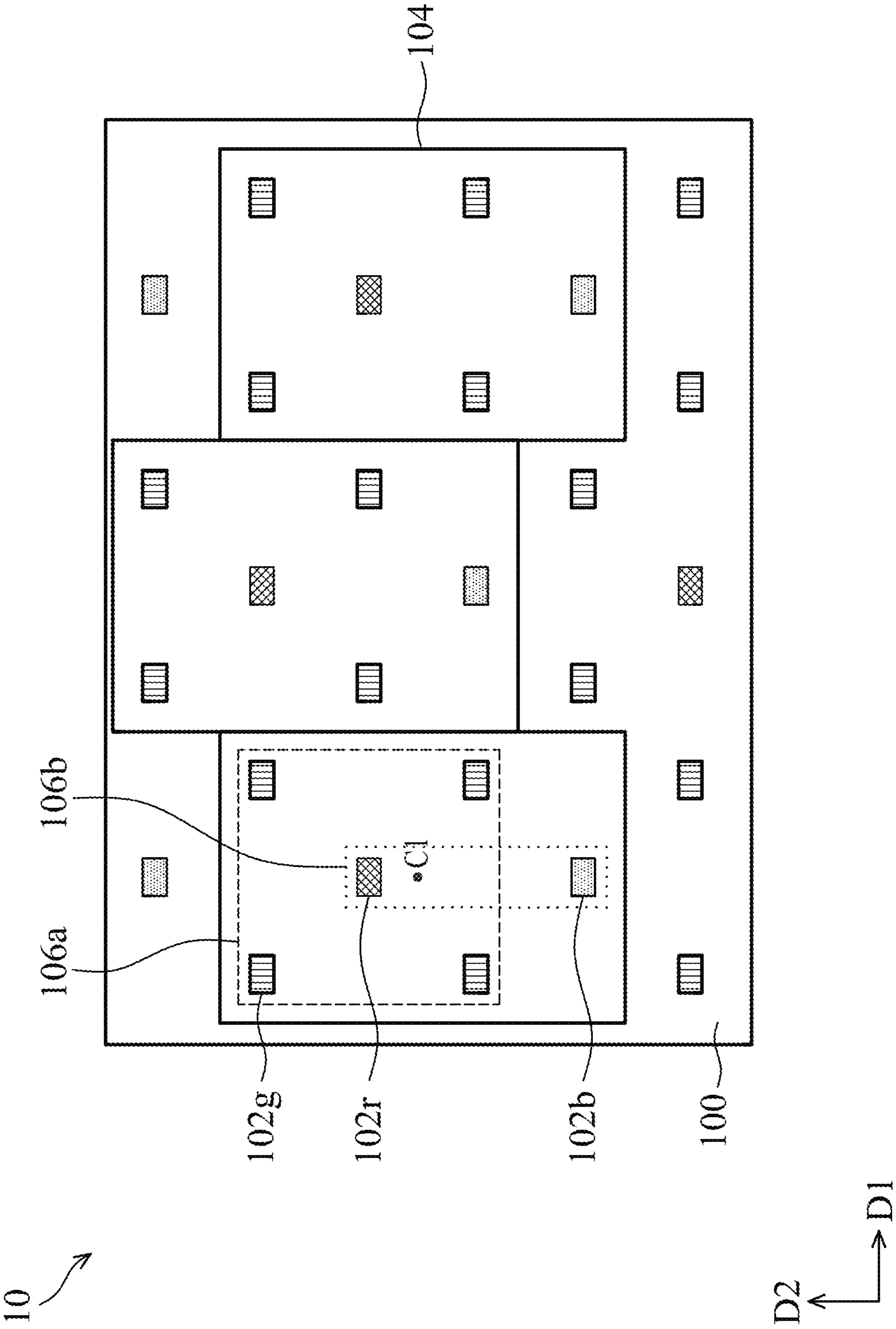

FIGS. 6A-6C illustrate some embodiments in which the ratio of the number of red chips, green chips and blue chips (RGB) within a minimal repeating unit 104 is 1:4:1 according to various embodiments of the present disclosure. First, referring to FIG. 6A, the minimal repeating units 104 may be of a kite shape, and are arranged in a staggered (rows and columns) manner in the inorganic LED display 10. The minimal repeating unit 104 includes 4 green chips, 1 red chip, and 1 blue chip in some embodiments. The four green chips are arranged to constitute a quadrilateral first subunit 106*a* (dashed line), and the one red chip and the one blue chip are arranged to constitute a rectangular second subunit 106*b* (dotted line). The first subunit 106*a* and the second subunit 106*b* have an overlapping area O which includes the geometric center C2 of the top-view shape of the first subunit 106*a*, such that the first subunit 106*a* and the second subunit 106*b* are substantially distributed at the geometric center C1 of the top-view shape of the minimal repeating unit 104. Hence, the red chip 102*r* and the blue chip 102*b* can evenly share colors with the surrounding green chips 102*g* as shown in FIG. 6A, so that the color resolution is improved and the image quality is enhanced.

Referring to FIG. 6B, a minimal repeating unit 104 includes 8 green chips, 2 red chips, and 2 blue chips in some embodiments. Four of the eight green chips are arranged to constitute a rectangular first subunit 106*a* (dashed line), the two red chips and the two blue chips are arranged to constitute a rectangular second subunit 106*b* (dotted line), and the remaining four green chips are arranged to constitute a rectangular third subunit 106*c* (dash-dotted line). The subunits 106*a*, 106*b*, and 106*c* partially overlap as shown in FIG. 6B.

Referring to FIG. 6C, a minimal repeating unit 104 includes 4 green chips, 1 red chip, and 1 blue chip in some embodiments. The four green chips are arranged to constitute a rectangular first subunit 106*a* (dashed line), and the one red chip and the one blue chip are arranged to constitute a rectangular second subunit 106*b* (dotted line). The first subunit 106*a* and the second subunit 106*b* are substantially distributed at the geometric center C1 of the top-view shape of the minimal repeating unit 104 as shown in FIG. 6C. It should be noted that the minimal repeating units 104 are adjacent to each other and are arranged in a staggered (rows and columns) manner in the inorganic LED display 10.

Figure 7A:
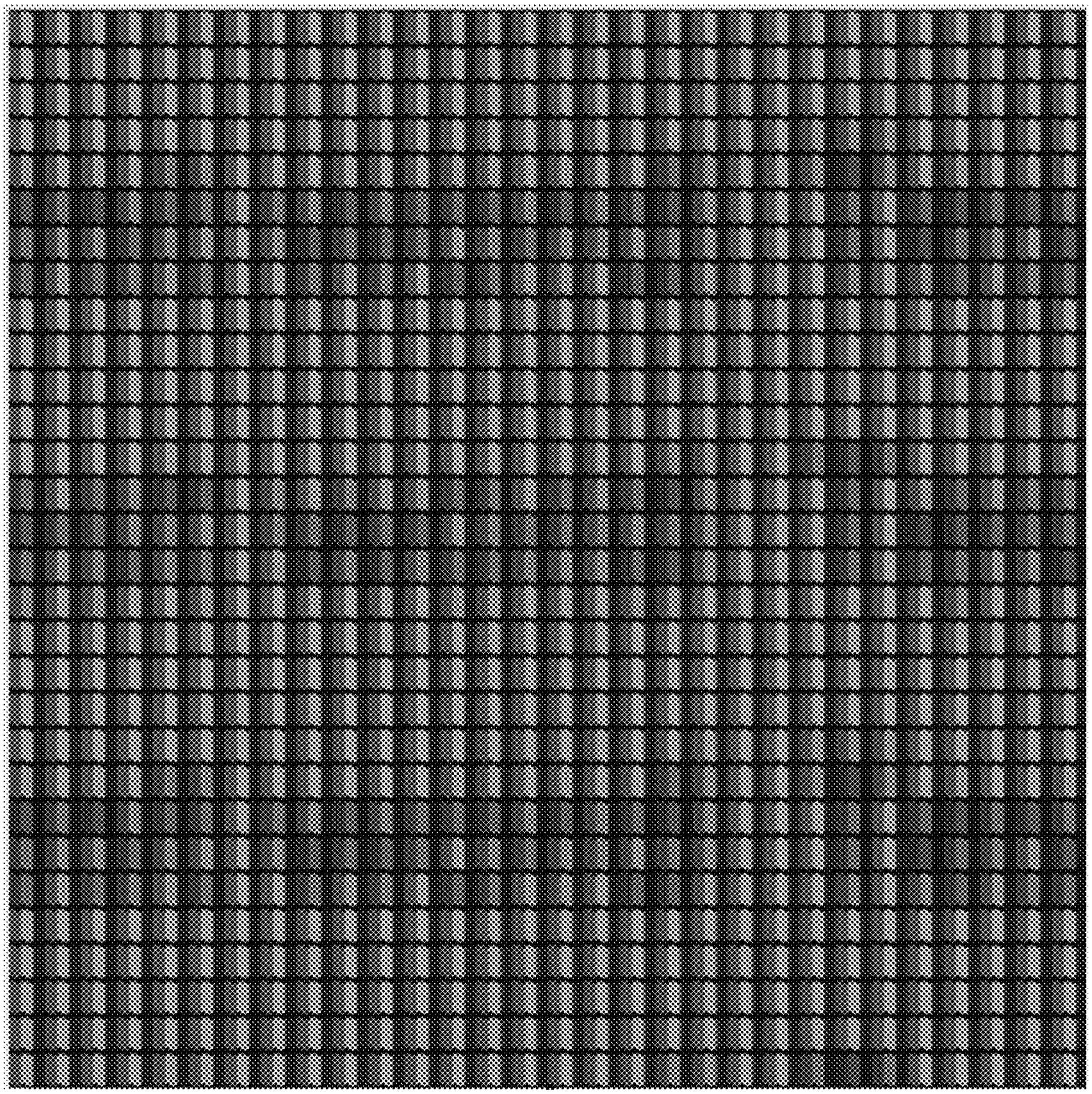
FIGS. 7A, 7B and 7C illustrate image simulations of various structures with different arrangements of sub-pixels by computers.
Figure 7B:
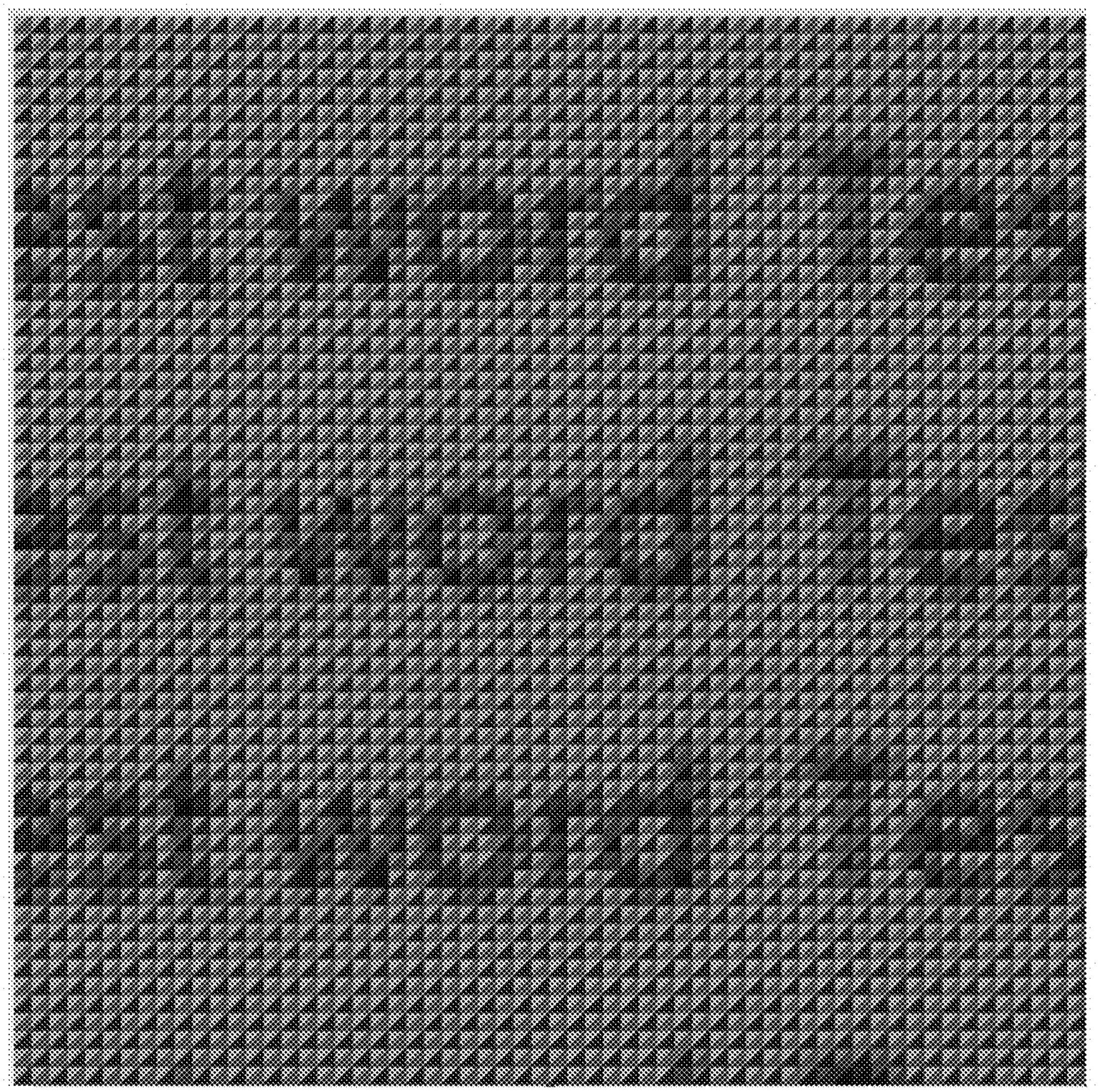
Figure 7C:
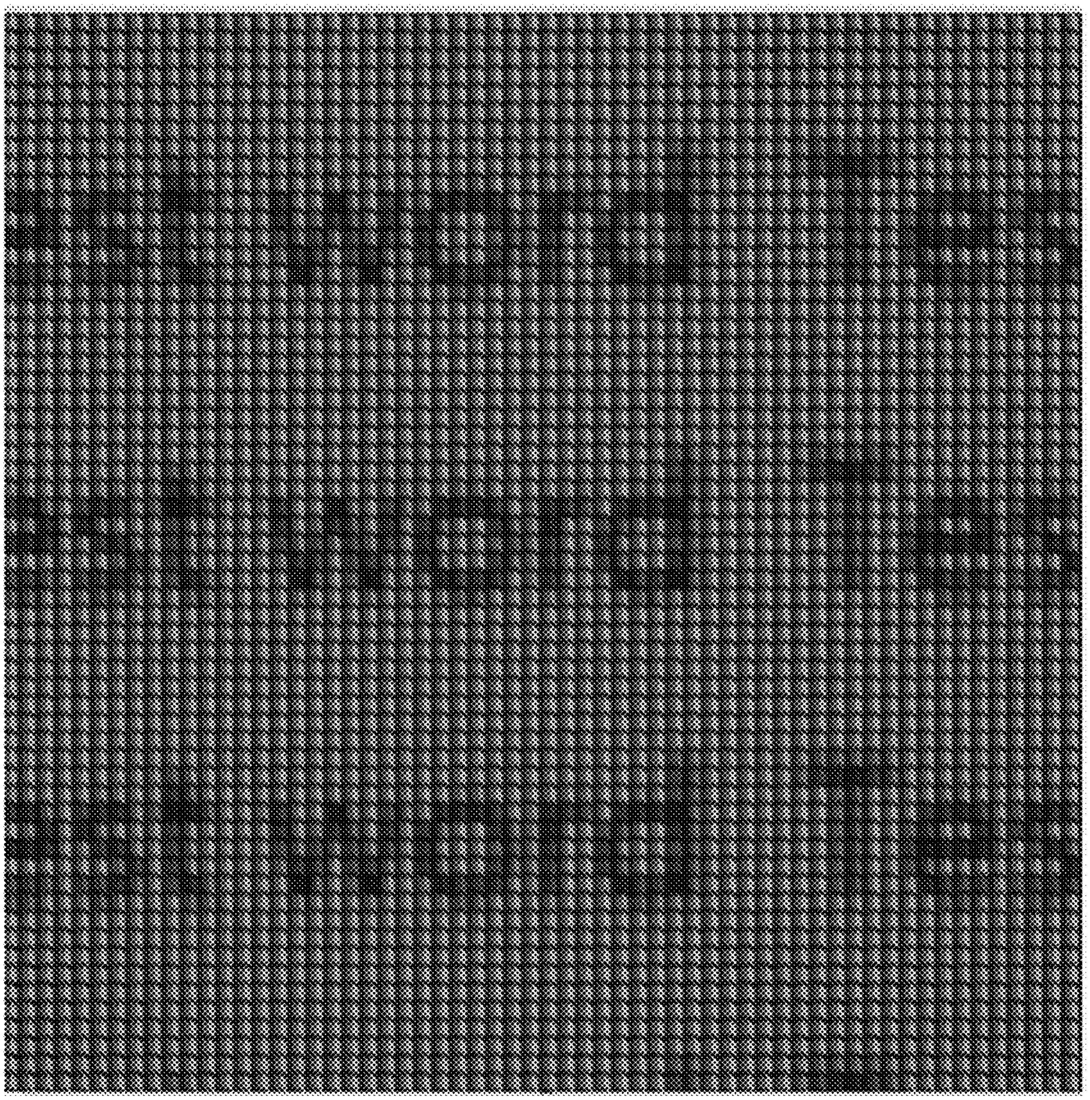

FIGS. 7A-7C illustrate the difference of the image quality between the embodiment of the present disclosure and the conventional display depending on the chip arrangements simulated by computers. FIGS. 7A and 7C are images simulating the sub-pixel arrangements in a conventional RGB stripe by computers. The difference is that the amount of chips in FIG. 7C is twice of that in FIG. 7A. FIG. 7B is a computer simulation of an image formed by some embodiments of the present disclosure which have sub-pixels with a ratio of red, green and blue chips (RGB) is 1:2:1 (as embodiments in FIG. 4A). Comparing FIG. 7B with FIG. 7A, it can be clearly seen that the resolution in FIG. 7B is higher than that in FIG. 7A. By adding one more green chip within the minimal repeating units 104 in the embodiment in FIG. 7B of the present disclosure, the resolution is comparable with that of conventional RGB stripe arrangement (as shown in FIG. 7C) which using double amount of chips, and the image quality is further enhanced.

It should be noted that the present disclosure generally describes sub-pixel arrangement structures of a display. Other sub-pixel arrangement structure may be used. For example, different types of LED chips may be used; LED chips with different light-emitting areas may be used, fewer or additional green chips, red chips, and blue chips may be used; and adjusting the relationship between the minimum distance between adjacent green chips and the minimum distance between adjacent red chips or blue chips may be used to form an inorganic LED display.

It is understood that the scope of the present disclosure is not limited to technical solutions formed by a specific combination of the above technical features, but also covers other technical solutions formed by any combination of the above technical features or their equivalents. The above embodiments can be arbitrarily combined to form new embodiments, and all the new embodiments formed by combination are within the protection scope of the present disclosure.

The sub-pixels arrangement of displays of the present disclosure can depend on the design requirements of the display, utilizing the characteristic that the human eye is more sensitive to the green light to add extra one or more green chips in the display so as to improve the image resolution of the display and enhance the image quality. For example, the display may be divided into several minimal repeating units in a parallel and/or staggered (rows and columns) arrangement. Next, red chips, blue chips and green chips are arranged in each minimal repeating unit, and the number of green chips is more than that of both red chips and blue chips. The LED chips in the minimal repeating unit are arranged in such a way that the green chips are substantially evenly distributed in the minimal repeating unit, and the red and blue chips are substantially evenly distributed around the green chips in the display. For example, the minimum repeating unit may include a plurality of subunits, and the subunits are roughly divided into two types, the first type of subunit and the second type of subunit. The first type of subunit includes at least two chips of the same color, such as two or more green chips, but is not limited thereto. In some embodiments, there may be a plurality of first-type subunits, for example, two or more first-type subunits. The second type of subunit includes at least two chips of different colors, for example, a red chip and a blue chip. In some embodiments, the second type of subunit may include green chips, for example, a red chip, a blue chip, and two green chips. By arranging the green chips in the display and adjusting the minimum distance between the adjacent green chips, image resolution can be improved, image quality is enhanced, and the use of chips can be reduced, thereby reducing the manufacturing cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An inorganic light-emitting diode (LED) display, comprising:

a first sub-unit, comprising four first LED chips arranged to form a first rectangle, wherein the four first LED chips locate at four corners of the first rectangle;

a second sub-unit, comprising four second LED chips other than the four first LED chips, arranged to form a second rectangle, wherein the four second LED chips locate at four corners of the second rectangle;

a third sub-unit, comprising four third LED chips other than the four first LED chips and the four second LED chips, arranged to form a third rectangle, wherein the four third LED chips locate at four corners of the third rectangle;

wherein the first rectangle, the second rectangle, and the third rectangle are overlapped with each other to form an overlapping area, wherein the first sub-unit, the second sub-unit and the third sub-unit collectively comprise a plurality of green LED chips and a plurality of non-green LED chips, the plurality of green LED chips is greater than the plurality of non-green LED chips in quantity, and wherein, the overlapping area merely comprises LED chips selected from the four first LED chips, the four second LED chips and the four third LED chips, and the overlapping area comprises one of the four first LED chips, one of the four second LED chips and one of the four third LED chips.

2. The inorganic LED display of claim 1, wherein one of the four first LED chips is located between two adjacent ones of the four second LED chips along a direction.

3. The inorganic LED display of claim 1, wherein the four first LED chips and the four third LED chips are green LED chips.

4. The inorganic LED display of claim 1, wherein the four second LED chips are non-green LED chips.

5. The inorganic LED display of claim 1, wherein the one of the four first LED chips and the one of the third LED chips are configured to emit light with a same color.

6. The inorganic LED display of claim 1, wherein the one of the four first LED chips and the one of the four second LED chips are configured to emit light with different colors.

7. The inorganic LED display of claim 1, wherein the overlapping area comprises two green LED chips.

8. The inorganic LED display of claim 1, wherein the overlapping area has a rectangular shape with four corners.

9. The inorganic LED display of claim 8, wherein the one of the four first LED chips, the one of the four second LED chips and the one of the four third LED chips are respectively located at three corners of the overlapping area.

10. The inorganic LED display of claim 1, wherein a minimum distance between two adjacent ones of the green LED chips is smaller than a minimum distance between two adjacent ones of the non-green LED chips along a direction.

11. The inorganic LED display of claim 1, wherein a minimum distance between two adjacent ones of the green LED chips is less than or equal to half of a minimum distance between two adjacent ones of non-green LED chips, and the minimum distance between two adjacent ones of the green LED chips is greater than or equal to one-quarter of the minimum distance between two adjacent ones of non-green LED chips.

12. The inorganic LED display of claim 1, wherein the first sub-unit, the second sub-unit, and the third sub-unit constitute a minimal repeating unit.

13. The inorganic LED display of claim 12, wherein an aperture ratio of the minimal repeating unit is smaller than 30%.

14. The inorganic LED display of claim 1, wherein the first LED chips, the second LED chips, and the third LED chips have substantially a same size.

15. The inorganic LED display of claim 1, wherein the non-green LED chips comprise a plurality of red LED chips and a plurality of blue LED chips.

16. The inorganic LED display of claim 15, wherein the red LED chips are greater than or equal to the blue LED chips in quantity.

17. The inorganic LED display of claim 1, wherein each of the first LED chips, the second LED chips, and the third LED chips comprises a pair of electrodes disposed on a side opposite to a light-emitting side of each of the LED chips.

18. The inorganic LED display of claim 1, wherein one of the four third LED chips is located between two adjacent ones of the four second LED chips along a direction.

19. The inorganic LED display of claim 1, wherein, in a top view, two of the four second LED chips are aligned with two of the four third LED chips along a first virtual line, another two of the four second LED chips are aligned with another two of the four third LED chips along a second virtual line substantially parallel to the first virtual line.

* * * * *